(12) United States Patent
Jung et al.

(10) Patent No.: US 11,707,005 B2
(45) Date of Patent: Jul. 18, 2023

(54) CHALCOGENIDE MATERIAL, VARIABLE RESISTANCE MEMORY DEVICE AND ELECTRONIC DEVICE

(71) Applicant: SK hynix Inc., Icheon (KR)

(72) Inventors: Gwang Sun Jung, Cheongju (KR); Sang Hyun Ban, Hwaseong (KR); Jun Ku Ahn, Hwaseong (KR); Beom Seok Lee, Suwon (KR); Young Ho Lee, Seongnam (KR); Woo Tae Lee, Seoul (KR); Jong Ho Lee, Seoul (KR); Hwan Jun Zang, Icheon (KR); Sung Lae Cho, Gwacheon (KR); Ye Cheon Cho, Icheon (KR); Uk Hwang, Yongin (KR)

(73) Assignee: SK hynix Inc., Icheon (KR)

( * ) Notice: Subject to any disclaimer, the term of this patent is extended or adjusted under 35 U.S.C. 154(b) by 234 days.

(21) Appl. No.: 16/855,760

(22) Filed: Apr. 22, 2020

(65) Prior Publication Data

US 2021/0083185 A1   Mar. 18, 2021

(30) Foreign Application Priority Data

Sep. 17, 2019   (KR) .......................... 10-2019-0114181

(51) Int. Cl.
*H10N 70/00*   (2023.01)
*G11C 13/00*   (2006.01)
*H10B 63/00*   (2023.01)

(52) U.S. Cl.
CPC ....... *H10N 70/8825* (2023.02); *G11C 13/003* (2013.01); *H10B 63/24* (2023.02); *H10N 70/841* (2023.02)

(58) Field of Classification Search
CPC .............. H01L 45/143; H01L 27/2427; H01L 45/1253; H01L 45/1233; H01L 27/224; H01L 45/06; H01L 45/141; H01L 45/122; H01L 45/144; H10N 70/8825; H10N 70/841; H10N 70/20; H10N 70/826; H10N 70/231; H10N 70/821; H10N 70/882; H10N 70/8828; H10B 63/24; H10B 63/80; H10B 61/10
See application file for complete search history.

(56) References Cited

U.S. PATENT DOCUMENTS

| | | | |
|---|---|---|---|
| 6,800,504 B2 | 10/2004 | Li et al. | |
| 9,236,566 B2 | 1/2016 | Bresolin et al. | |
| 10,008,665 B1* | 6/2018 | Gealy | G11C 13/0069 |
| 10,163,977 B1* | 12/2018 | Fantini | H01L 45/04 |
| 2017/0244026 A1* | 8/2017 | Wu | H01L 45/126 |

* cited by examiner

*Primary Examiner* — Allison Bernstein

(57) ABSTRACT

A chalcogenide material may include germanium (Ge), arsenic (As), selenium (Se) and from 0.5 to 10 at % of at least one group 13 element. A variable resistance memory device may include a first electrode, a second electrode, and a chalcogenide film interposed between the first electrode and the second electrode and including from 0.5 to 10 at % of at least one group 13 element. In addition, an electronic device may include a semiconductor memory. The semiconductor memory may include a column line, a row line intersecting the column line, and a memory cell positioned between the column line and the row line, wherein the memory cell comprises a chalcogenide film including germanium (Ge), arsenic (As), selenium (Se), and from 0.5 to 10 at % of at least one group 13 element.

14 Claims, 10 Drawing Sheets

CHALCOGENIDE MATERIAL, VARIABLE RESISTANCE MEMORY DEVICE AND ELECTRONIC DEVICE

CROSS-REFERENCE TO RELATED APPLICATION

The present application claims priority under 35 U.S.C. § 119(a) to Korean Patent Application Number 10-2019-0114181, filed on Sep. 17, 2019, in the Korean Intellectual Property Office, the entire disclosure of which is incorporated herein by reference.

BACKGROUND

1. Technical Field

The present disclosure relates to a chalcogenide material and an electronic device, and more particularly, to a chalcogenide material, a variable resistance memory device, and an electronic device including the chalcogenide material.

2. Description of Related Art

In recent years, considerable efforts have been made to provide electronic devices that are smaller, more compact, more robust and more efficient. In particular, recent efforts have focused on improving switching devices that switch between resistive states. Examples of such a semiconductor device include a resistive random access memory (RRAM), a phase-change random access memory (PRAM), a ferroelectric random access memory (FRAM), a magnetic random access memory (MRAM), an e-fuse, and the like.

SUMMARY

Embodiments of the present disclosure provide a chalcogenide material, a variable resistance memory device, and an electronic device capable of improving an operating characteristics and reliability.

A chalcogenide material according to an embodiment of the present disclosure may include germanium (Ge), arsenic (As), selenium (Se) and from 0.5 to 10 at % of at least one group 3 element.

A variable resistance memory device according to an embodiment of the present disclosure may include a first electrode, a second electrode, and a chalcogenide film interposed between the first electrode and the second electrode and including from 0.5 to 10 at % of at least one group 13 element.

An electronic device according to an embodiment of the present disclosure may include a semiconductor memory. The semiconductor memory may include a column line, a row line intersecting the column line, and a memory cell positioned between the column line and the row line, wherein the memory cell comprises a chalcogenide film including germanium (Ge), arsenic (As), selenium (Se), and from 0.5 to 10 at % of at least one group 13 element.

By including the group 13 element in the chalcogenide material, an electrical characteristic such as a drift characteristic, thermal stability, and a threshold voltage (Vth) of the selection element may be improved. In addition, characteristics of the variable resistance memory device, the semiconductor memory, or the electronic device may be improved.

DETAILED DESCRIPTION

Figure 1A:
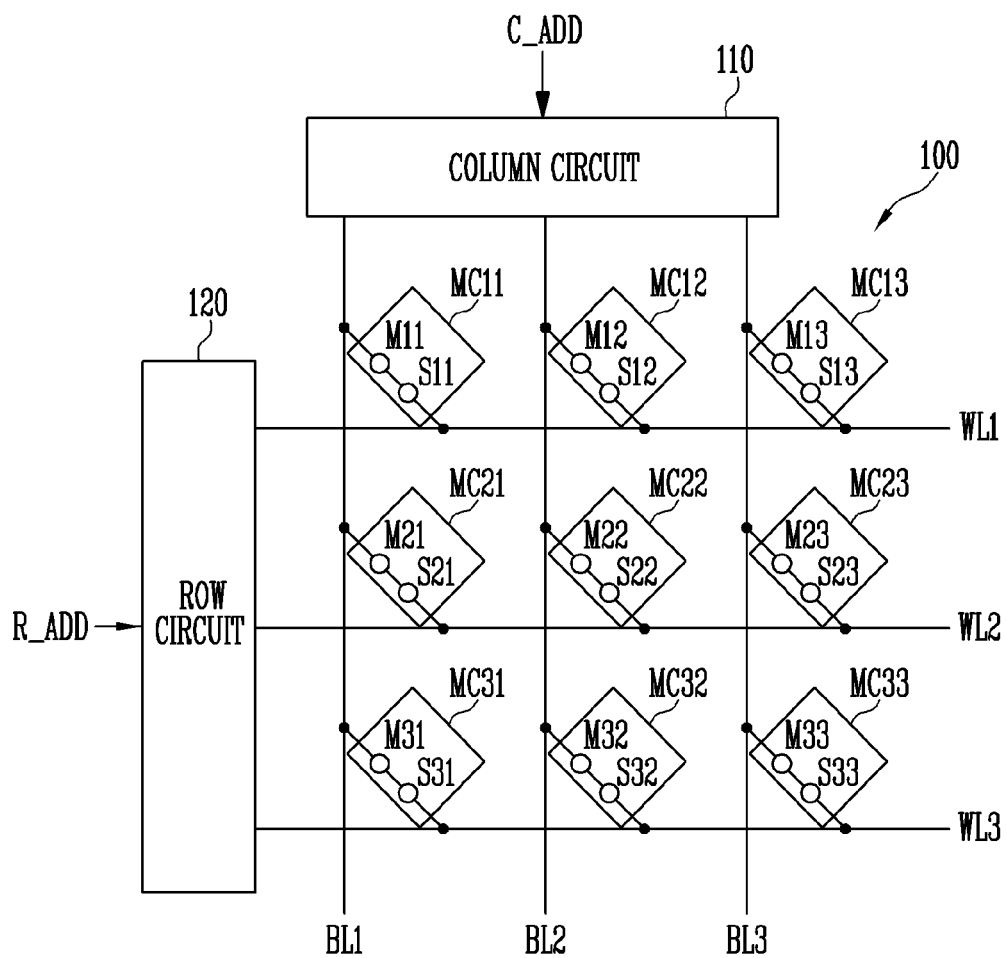
FIGS. 1A and 1B are diagrams for describing a structure of an electronic device according to an embodiment of the present disclosure.

Hereinafter, various embodiments are described in detail with reference to the accompanying drawings.

The drawings are not necessarily to scale, and in some examples, proportions of at least some of the structures shown in the drawings may be exaggerated to clearly show a characteristic of the embodiments. When a multi-layer structure having two or more layers is disclosed in the drawings or the detailed description, a relative positional relationship or arrangement order of the layers as shown merely reflect a specific example and the present disclosure is not limited thereto. The relative positional relationship or arrangement order of the layers may vary. In addition, a drawing or a detailed description of a multi-layer structure may not reflect all layers present in a specific multi-layer structure (for example, there may be more than one additional layer between shown two layers). For example, when a first layer is present on a second layer or a substrate in the multi-layer structure of the drawings or the detailed description, the first layer may be formed directly on the second layer or directly on the substrate, and one or more other layers may be present between the first layer and the second layer or between the first layer and the substrate.

Figure 1B:
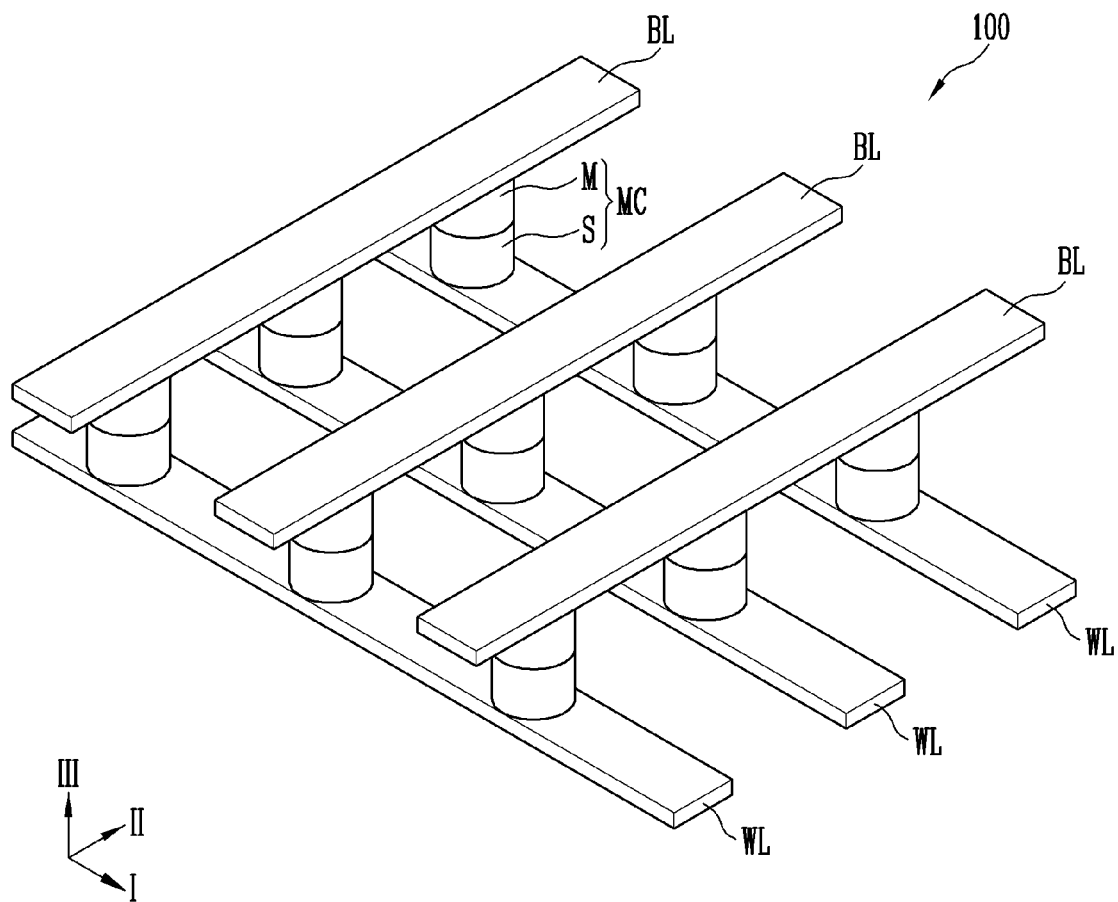

FIGS. 1A and 1B are diagrams for describing a structure of an electronic device according to an embodiment of the present disclosure. FIG. 1A is a circuit diagram of a memory cell array and FIG. 1B is a perspective view of a memory cell array.

Referring to FIG. 1A, an electronic device according to an embodiment of the present disclosure may include a semiconductor memory. The semiconductor memory may be non-volatile memory, and may be implemented as a variable resistance memory device. The semiconductor memory may include row lines and column lines intersecting the row lines. Here, the row lines may be word lines, and the column lines may be bit lines. However, embodiments are not limited to this arrangement, and in other embodiments the row lines may be bit lines and the column lines may be word lines. Hereinafter, it is assumed that the row lines are word lines and the column lines are bit lines.

The memory cell array 100 may include memory cells MC11 to MC33 disposed between the column lines BL1 to BL3 and the row lines WL1 to WL3, respectively. Here, the memory cells MC11 to MC33 may be disposed at points where the column lines BL1 to BL3 and the row lines WL1 to WL3 intersect. Each of the memory cells MC11 to MC33 may include at least one respective selection element S11 to S33 and memory element M11 to M33. Each of the memory cells MC11 to MC33 may include at least one of the selection elements S11 to S33 and the memory elements M11 to M33 connected in series. In this case, the selection elements S11 to S33 may be electrically connected to the row lines WL1 to WL3, and the memory elements M11 to M33 may be electrically connected to the column lines BL1 to BL3.

Each of the memory elements M11 to M33 may include a memory pattern as a storage node for storing data. For example, the memory elements M11 to M33 may include a variable resistance material such as a resistive material, a magnetic tunnel junction (MTJ), or a phase change material. The selection elements S11 to S33 are for selecting a particular memory cell MC and may include a switching material. The selection elements S11 to S33 may be a diode such as a PNP diode, a Bipolar Junction Transistor (BJT), a metal insulator transition (MIT) element, a mixed ionic-electronic conduction (MIEC) element, an ovonic threshold switching (OTS) element, or the like. The ovonic threshold switching (OTS) element may include a chalcogenide film. The chalcogenide film may have an amorphous state and may be an ovonic threshold switching material.

For reference, a shape and a configuration of each of the memory cells MC11 to MC33 may be variously modified. For example, the selection elements S11 to S33 may be omitted, or the memory elements M11 to M33 may be omitted. Alternatively, positions of the selection elements S11 to S33 and the memory elements M11 to M33 may be reversed. In this case, the selection elements S11 to S33 may be electrically connected to the column lines BL1 to BL3, and the memory elements M11 to M33 may be electrically connected to the row lines WL1 to WL3.

In addition, the semiconductor memory may further include a column circuit 110 for controlling the column lines BL1 to BL3 and a row circuit 120 for controlling the row lines WL1 to The row circuit 120 may be a row decoder, a word line decoder, a word line driver, or the like. The row circuit 120 may select a row line such as WL2 from among the row lines WL1 to WL3 according to a row address R_ADD. The column circuit 110 may be a column decoder, a bit line decoder, a bit line driver, or the like. The column circuit 110 may select a column line such as column line BL2 from among the column lines BL1 to BL3 according to a column address C_ADD. When the row line WL2 and column line BL2 are selected, the memory cell MC22 connected between the selected column line BL2 and the selected row line WL2 may be selected.

For reference, FIG. 1A shows three column lines BL1 to BL3 and three row lines WL1 to WL3, but this is merely for convenience of description, and the present disclosure is not limited thereto. The number of the column lines BL1 to BL3 and the row lines WL1 to WL3 included in the memory cell array 100 may be changed for different embodiments.

Referring to FIG. 1B, a memory cell array 100 may include column lines BL and row lines WL positioned at different levels. For example, the column lines BL may be positioned over the row lines WL. In addition, the row lines WL may extend in a first direction I in parallel and the column lines BL may extend in parallel in a second direction II that intersects the first direction I.

The memory cells MC may be disposed at intersections of the column lines BL and the row lines WL, and may be arranged in a matrix shape. For example, the row lines WL and column lines BL may be arranged in an orthogonal grid pattern. In addition, each of the memory cells MC may be a memory stack and may include a memory element M and a selection element S stacked in a third direction III. Here, the third direction III is a direction intersecting the first direction I and the second direction II, and may be a direction perpendicular to the first direction I and the second direction II.

In addition, although the memory cell array 100 in FIG. 1B has a single-deck structure, the present disclosure is not limited to a single layer. In other embodiments, a plurality of layers of the memory cells MC may be stacked in the third direction III. For example, the cell array may have a multi-deck structure in which row lines WL and column lines BL are alternately stacked in the third direction III. In this case, the memory cells are positioned between the alternately stacked row lines WL and the column lines BL.

The cross-point array structure described above has an advantage of being an efficient use of space, which can improve device integration. In addition, a multi-deck structure improves the degree of integration for a memory device compared to a single layer structure.

Figure 2A:
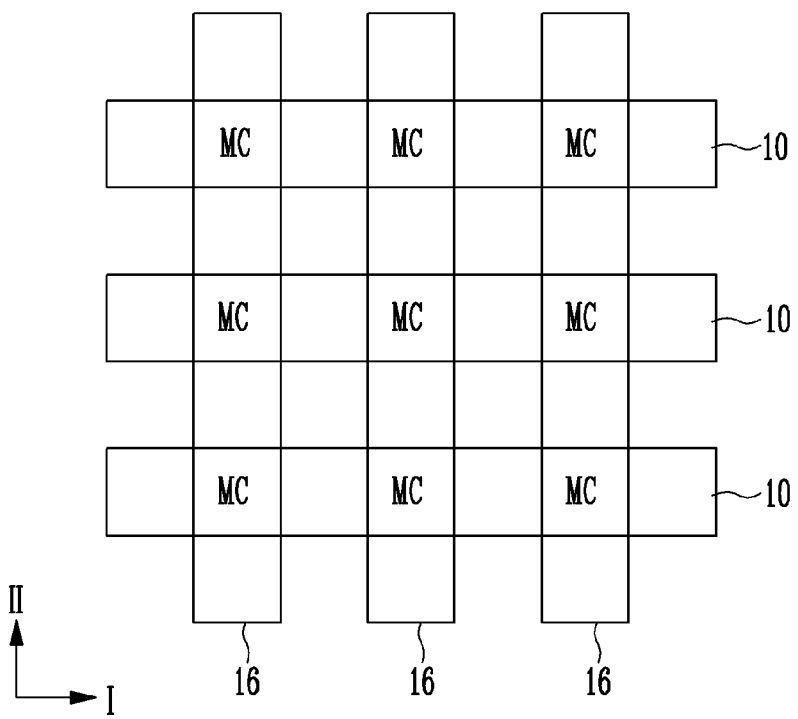
FIGS. 2A, 2B and 2C are diagrams illustrating a structure of an electronic device according to an embodiment of the present disclosure.
Figure 2B:
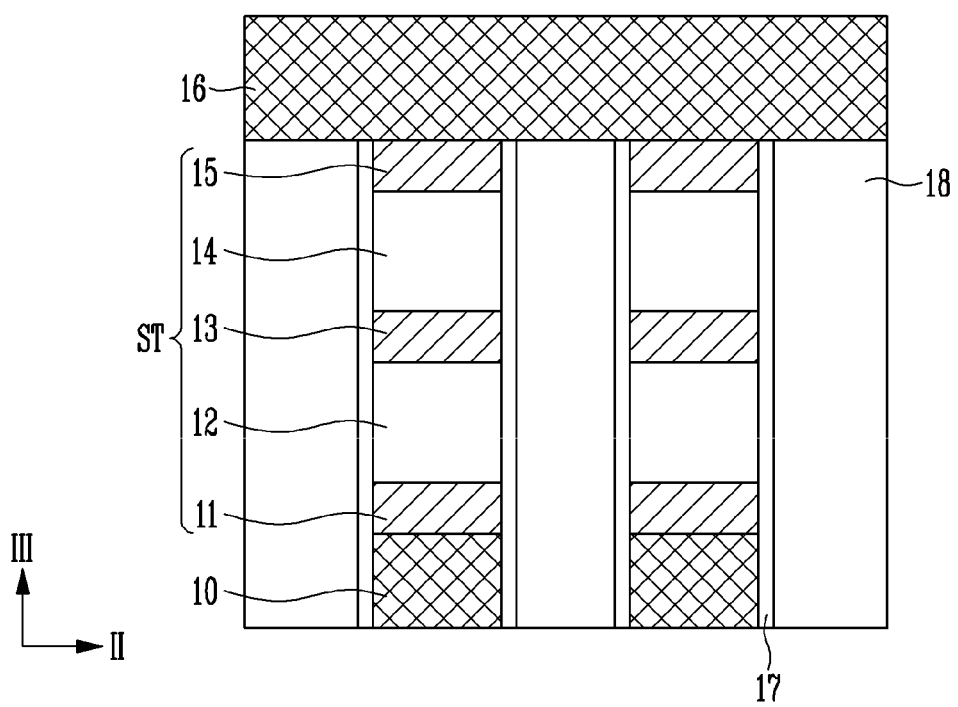
Figure 2C:
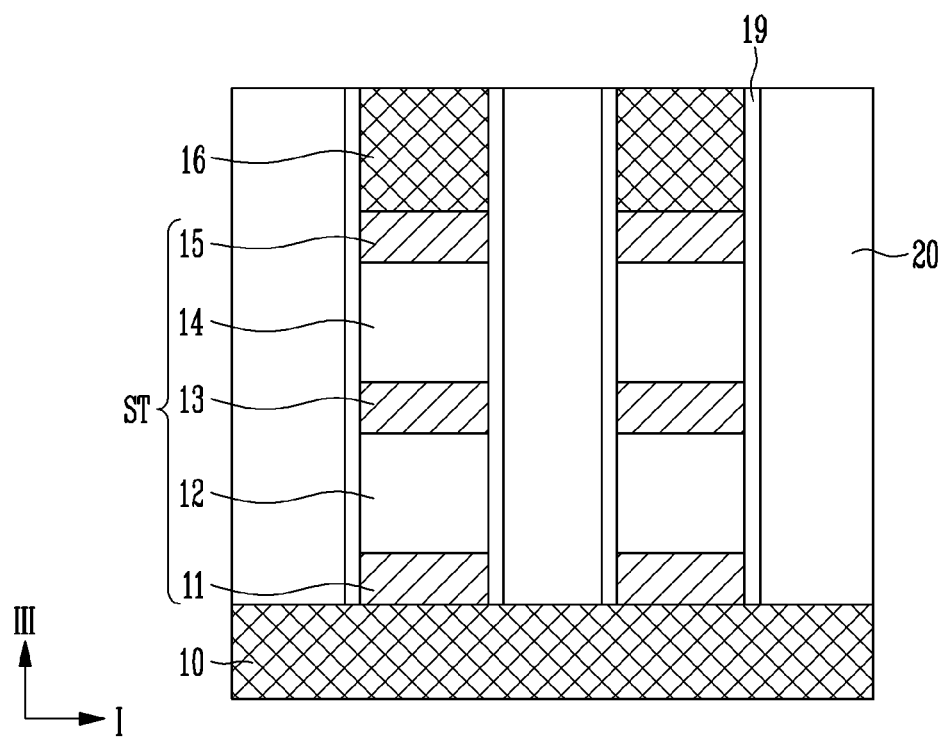

FIGS. 2A to 2C are diagrams illustrating a structure of an electronic device according to an embodiment of the present disclosure. FIG. 2A is a layout, FIG. 2B is a cross-sectional view in the second direction II of FIG. 2A, and FIG. 2C is a cross-sectional view in the first direction I of FIG. 2A.

Referring to FIGS. 2A to 2C, an electronic device according to an embodiment of the present disclosure may include a semiconductor memory, and the semiconductor memory may include a plurality of memory cells. The semiconductor memory may be a non-volatile memory device or a variable resistance memory device.

Each of the memory cells MC may include a stack ST, and the stack ST may be positioned at an intersection of row lines 10 and column lines 16. Each of the stacks ST may include a first electrode 11, a switching film 12, a second electrode 13, a variable resistance film 14, and a third electrode 15 that are sequentially stacked. In addition, protective films 17 and 19 may be formed on a sidewall of the stacks ST, and insulating films 18 and 20 may be fill spaces between the stacks ST.

The variable resistance film 14 may have a characteristic of reversibly transitioning between different resistance states according to an applied voltage or current. Therefore, when the variable resistance film 14 has a low resistance state, data '1' may be stored, and when the variable resistance film 14 has a high resistance state, data '0' may be stored.

When the variable resistive film 14 is a resistive material, the variable resistive film 14 may include a transition metal oxide or may include a metal oxide such as a perovskite based material. Therefore, an electrical path may be created or removed in the variable resistive film 14, and thus data may be stored in a memory cell.

When the variable resistance film 14 has an MTJ structure, the variable resistance film 14 may include a magnetization fixed layer, a magnetization free layer, and a tunnel barrier layer interposed therebetween. The magnetization fixed layer and the magnetization free layer may include a magnetic material, and the tunnel barrier layer may include an oxide such as magnesium (Mg), aluminum (Al), zinc (Zn), or titanium (Ti). Here, a magnetization direction of the magnetization free layer may be changed by a spin torque of electrons in an applied current. Therefore, data may be stored according to the change in the magnetization direction of the magnetization free layer with respect to a magnetization direction of the magnetization fixed layer.

When the variable resistance film 14 is a phase change material, the variable resistance film 14 may include a chalcogenide based material. The variable resistance film 14 may include silicon (Si), germanium (Ge), antimony (Sb), telelium (Te), bismuth (Bi), indium (In), tin (Sn), selenium (Se), or the like, or a combination thereof, as the chalcogenide based material. For example, the variable resistance film 14 may be Ge—Sb—Te (GST), and may be $Ge_2Sb_2Te_5$, $Ge_2Sb_2Te_7$, $GeiSb_2Te_4$, $GeiSb_4Te_7$, and the like. Here, a chemical composition ratio of the variable resistance film 14 may be determined in consideration of characteristics such as a melting point and a crystallization temperature, and the variable resistance film 14 may further include an impurity such as carbon (C) and nitrogen (N). The phase change material has a low resistance characteristic in a crystalline state and has a high resistance characteristic in an amorphous state. Therefore, data may be stored by a set operation that changes from a high resistance amorphous state to a low resistance crystalline state and a reset operation that changes from a low resistance crystalline state to a high resistance amorphous state.

The switching film 12 may be a selection element that adjusts a current flow according to a magnitude of an applied voltage or current. Therefore, the switching film 12 may have minimal current flow when the magnitude of the applied voltage or current is equal to or less than a predetermined threshold value, and the amount of current flowing through the switching film rapidly increases when the magnitude of the applied voltage or current is greater than the predetermined threshold value. The rapidly increasing current may be proportional to the magnitude of the applied voltage or current.

The switching film 12 may include a chalcogenide based material and may include a group 13 element. The group 13 element may be boron (B), aluminum (Al), gallium (Ga), indium (In) or thallium (Tl). The switching film 12 may include boron (B), aluminum (Al), gallium (Ga), indium (In), or thallium (Tl), or a combination thereof. The switching film 12 may be a ternary chalcogenide material including a group 14 element, a group 15 element, and a group 16 element, and may be a IV-V-VI chalcogenide material. For example, the switching film 12 may include germanium (Ge), arsenic (As), selenium (Se), and a group 13 element. In addition, the switching film 12 may include 0.5 to 10 at % of the group 13 element, or may include 0.5 to 3 at % of the group 13 element. Although the term "group 13 element" is referred to here in singular form for convenience of description, embodiments are not limited to a single group 13 element, and in some embodiments multiple group 13 elements are present in the chalcogenide-based material.

The first electrode 11 may be electrically connected to the row line 10, the second electrode 13 may be interposed between the switching film 12 and the variable resistance film 14, and the third electrode 15 may be electrically connected to the column line 16. The first electrode 11, the second electrode 13, and the third electrode 15 may include a conductive material such as metal, or metal nitride. For example, each of the first electrode 11, the second electrode 13, and the third electrode 15 may include tungsten (W), tungsten nitride (WN), tungsten silicide (WSi), titanium (Ti), titanium nitride (TiN), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), and the like, and may include a combination thereof.

Each of the first electrode 11, the second electrode 13, and the third electrode 15 may have a single film structure or a multi-layer film structure. When the first electrode 11, the second electrode 13, or the third electrode 15 has the multi-layer film structure, the first electrode 11, the second electrode 13, or the third electrode 15 may be an interface electrode that is in contact with the variable resistance film 14 or the switching film 12. The first electrode 11, the second electrode 13, and the third electrode 15 may have the same thickness or different thicknesses from one another. In addition, a shape and a configuration of the stack ST may vary between different embodiments. For example, in some embodiments, at least one of the first electrode 11, the second electrode 13, and the third electrode 15 may be omitted.

In addition, in order to improve characteristics of the memory cell MC or to improve a process of forming the memory cell, an interface between the films 11 to 15 included in the stack ST may be modified, or one or more films may be added to the interface. For example, an interface between the third electrode 15 and the variable resistance film 14 or an interface between the second electrode 13 and the switching film 12 may be modified, or an interface film may be added to the interface.

The protective films 17 and 19 may protect the stacks ST during a manufacturing process and may be formed on the sidewall of the stacks ST. Here, the protective film 17 may be formed to cover sidewalls that face each other in the second direction II of the stack ST and may extend in the first direction I. The protective film 19 may be formed to cover sidewalls that face each other in the first direction I of the stack ST and may extend in the second direction II. The protective films 17 and 19 may be formed of a non-conductive material, and may include oxide, nitride, polysilicon, and the like. For example, the protective films 17 and 19 may include silicon oxide ($SiO_x$), silicon nitride ($Si_3N_4$), polysilicon, titanium nitride (TiN), tantalum nitride (TaN), or a combination thereof. In addition, each of the protective films 17 and 19 may be a single layer film or a multi-layer film.

In addition, the insulating films 18 and 20 may be formed between adjacent stacks ST, and may fill a space between the adjacent stacks ST. Here, the insulating film 18 may fill the space between stacks ST that are adjacent in the second direction II, and the insulating film 20 may fill the space between stacks ST that are adjacent in the first direction I. The insulating films 18 and 20 may include an oxide such as silicon oxide ($SiO_2$), may include a fluidity oxide film such as spin on coating (SOC), spin on dielectric (SOD), or may include a combination thereof.

According to the structure described above, the first electrode 11, the switching film 12, and the second electrode 13 may configure the selection element. The memory element may include the second electrode 13, the variable resistance film 14, and the third electrode 15, and may share the second electrode 13 with the selection element.

Here, the selection element may be an OTS element including a chalcogenide film doped with a group 13 element. A chalcogenide film may have an amorphous state.

However, since conventional chalcogenide films may be metastable materials, a resistance value of the chalcogenide film may change over time, and the changed resistance value may change a threshold voltage Vth of the selection element. In conventional chalcogenide films, the metastable amorphous state may be disturbed, which may result in changed electrical properties affecting threshold voltage Vth. Embodiments of the present disclosure increase the stability of a chalcogenide film switching element and improve the stability of the amorphous state by doping with a group 13 element, thereby improving the stability of threshold voltage Vth. Accordingly, embodiments may prevent a read window margin from being decreased, which improves the operational reliability of a memory device.

Figure 3A:
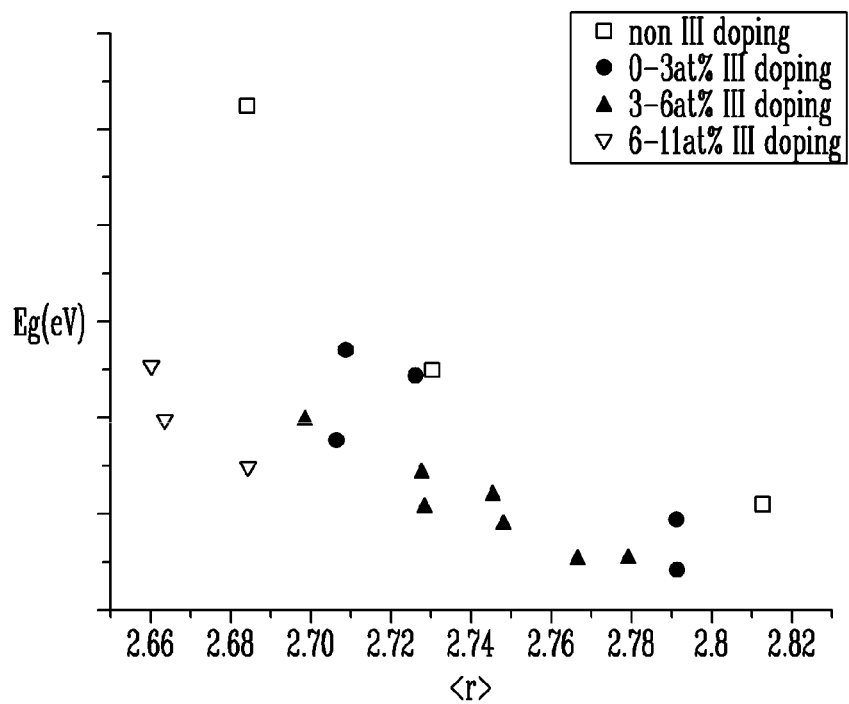
FIGS. 3A and 3B are graphs illustrating characteristics of a chalcogenide material according to an embodiment of the present disclosure.
Figure 3B:
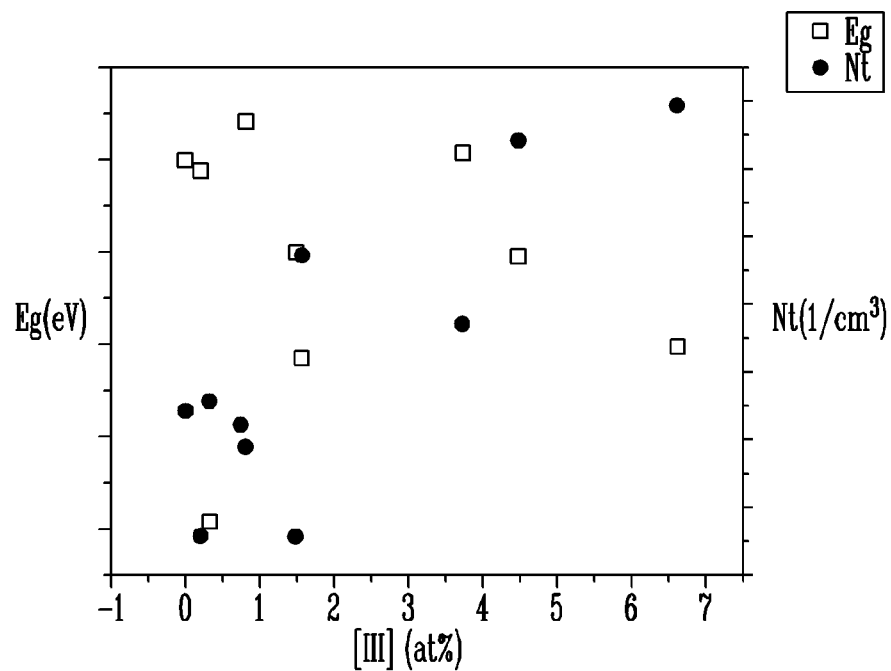

FIGS. 3A and 3B are graphs illustrating a characteristic of the chalcogenide material according to an embodiment of the present disclosure.

A chalcogenide material according to an embodiment of the present disclosure may be a IV-V-VI chalcogenide material in which a group 13 element is doped. For example, the chalcogenide material may include from 15 to 34 at % of a group 14 element, from 15 to 37 at % of a group 15 element, and from 33 to 70 at % of a group 16 element. In an embodiment, the group 13, 4, 5 and 6 elements are substantially all of the materials present in the chalcogenide material, and only trace amounts of elements outside these groups are present.

The chalcogenide material may be $Ge_aAs_bSe_cX_{1-(a+b+c)}$, in which X represents a group 13 element. Here, a doping concentration of the group 13 element (X) may be determined in consideration of the desired characteristics of the chalcogenide material. For example, the doping concentration may be determined to maintain a matrix of chalcogenide, to maintain an amorphous state, or to minimize a resistance variation. In addition, the doping concentration may be determined so that an electronic device, a variable resistance memory device, a memory cell, or a selection element to which the chalcogenide material is applied has an appropriate Vth and to minimize variation in Vth. For example, the doping concentration of the group 13 element (X) may be less than half ([IV]+[V])/2) of a sum of a concentration of the group 14 element and a concentration of the group 15 element. When the doping concentration of the group 13 element (X) is higher than the half ([IV]+[V])/2) of the sum of the concentration of the group 14 element and the concentration of the group 15 element, the group 13 element (X) may be a primary element of the chalcogenide material, in which case the matrix of the chalcogenide material may be less stable.

In some embodiments, the chalcogenide may include from 0.5 to 10 at % of the group 13 element (X), and in another embodiment the amount of group 13 element (X) may be from 0.5 to 3 at %. In addition, the chalcogenide material may include from 12 to 33 at % of germanium (Ge), from 12 to 36 at % of arsenic (As), and from 30 to 69 at % of selenium (Se). That is, $0.12 \le a \le 0.33$ may be satisfied, $0.12 \le b \le 0.36$ may be satisfied, and $0.30 \le c \le 0.69$ may be satisfied.

FIG. 3A is a graph illustrating band gap energy of a chalcogenide material doped with a group 13 element. The X axis of the graph represents a mean coordination number r, and the Y axis represents the band gap energy Eg in an eV unit.

In FIG. 3A, r represents the mean coordination number of an element included in the chalcogenide material. In addition, the graph shows each of a case where the group 13 element is not doped, a case where the group 13 element is doped at a concentration of 0 to 3 at %, a case where the group 13 element is doped at a concentration of 3 to 6 at %, and a case where the group 13 element is doped at a concentration of 6 to 11 at %.

Referring to FIG. 3A, when the chalcogenide material is doped with the group 13 element, the band gap energy Eg may be decreased. When the band gap energy Eg is equal to or less than a predetermined value, the chalcogenide material may not be effective as a switching material. Therefore, embodiments may limit a concentration of the group 13 element in consideration of the band gap energy Eg. For example, the chalcogenide material may include equal to or less than 10 at % of a group 13 element. In addition, the chalcogenide material may include the group 13 element at 0.5 to 3 at %. Within that range, the decrease of the band gap energy Eg is not significant compared to a non-doped material.

FIG. 3B is a graph illustrating a relationship between the band gap energy and a trap density of a chalcogenide material doped with the group 13 element. The X axis represents the concentration of the group 13 element in atomic percentage (at %), the left Y axis represents the band gap energy Eg in electron volts (eV), and the right Y axis represents trap density Nt per unit volume of $1/cm^3$.

Referring to FIG. 3B, the band gap energy Eg decrease as the concentration of the group 3 group 13 element increases. In particular, when the concentration of the group 3 group 13 element exceeds 3 at %, the energy band gap Eg decreases. In addition, the trap density Nt increases as the concentration of the group 3 group 13 element increases. As the trap density Nt increases, the threshold voltage may increase, but there is an adverse effect in which the energy band gap Eg decreases. Therefore, by limiting the concentration of the group 3 group 13 element in consideration of the increase of the threshold voltage and the decrease of the energy band gap Eg, electrical characteristics of the chalcogenide material may be improved. In an embodiment, the chalcogenide material may include the group 3 group 13 element equal to or less than 3 at %, and may include the group 3 group 13 element at 0.5 to 3 at %.

Figure 4A:
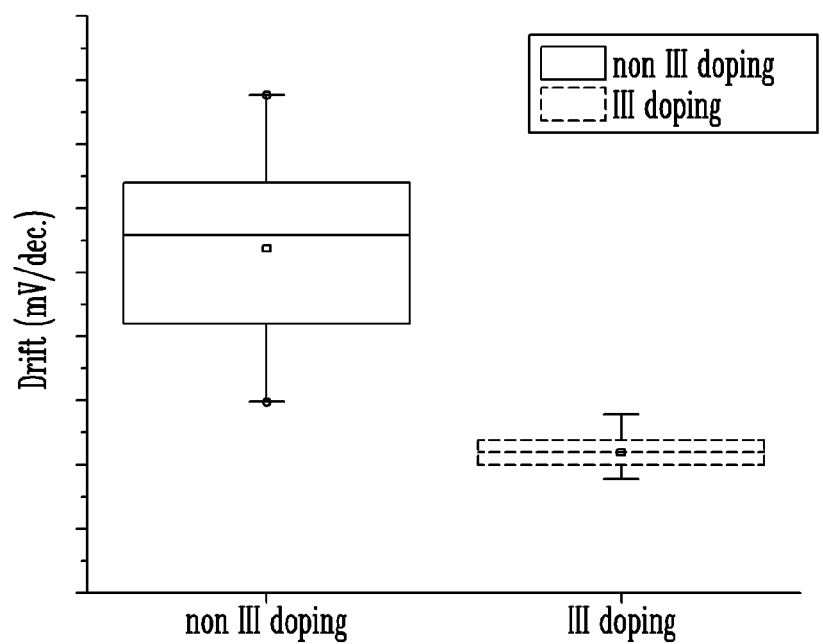
FIGS. 4A, 4B and 4C are graphs illustrating characteristics of a selection element according to an embodiment of the present disclosure.
Figure 4B:
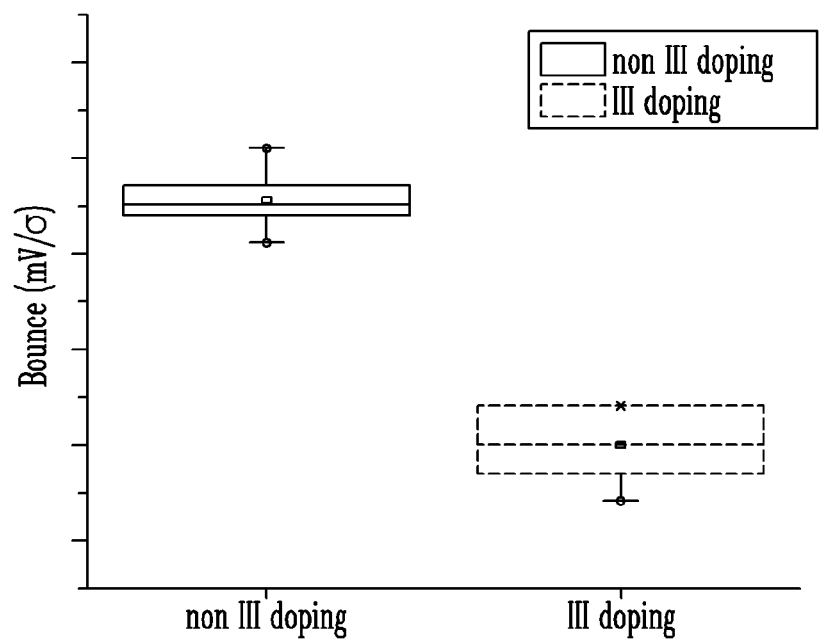
Figure 4C:
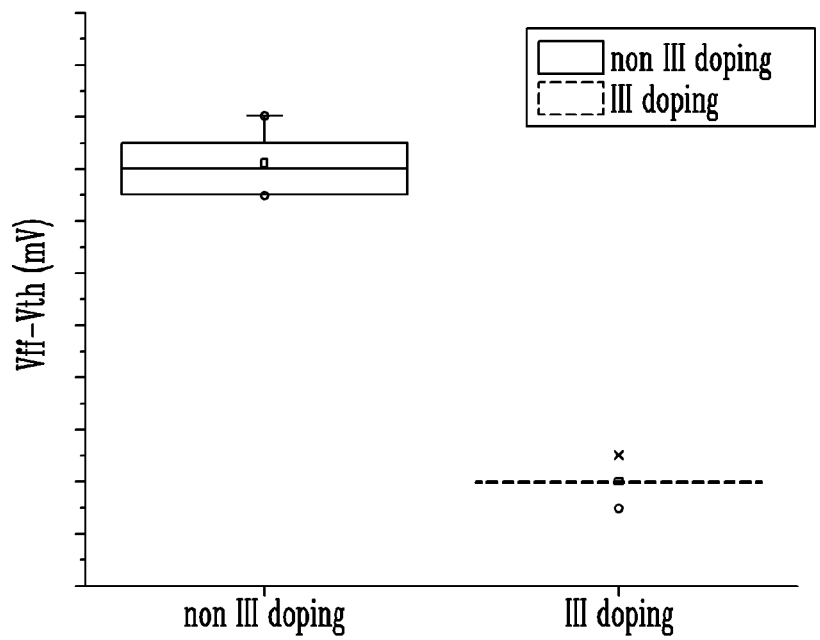

FIGS. 4A to 4C are graphs illustrating characteristics of the selection elements according to embodiments of the present disclosure. Hereinafter, description repetitive to the above description may be omitted for the sake of clarity.

A selection element according to an embodiment of the present disclosure may include a first electrode, a second electrode, and a chalcogenide film interposed between the first electrode and the second electrode. The chalcogenide film may include a ternary chalcogenide switching material including a group 14 element, a group 15 element, and a group 16 element.

The chalcogenide film may include germanium (Ge), arsenic (As), selenium (Se), and a group 13 element (X). The chalcogenide film may be $Ge_aAs_bSe_cX_{1-(a+b+c)}$. Here, the group 13 element (X) may be present in a concentration from 0.5 to 10 at %, or may be present in a concentration from 0.5 to 3 at %. In addition, the germanium (Ge) may be 12 to 33 at %, the arsenic (As) may be 12 to 36 at %, the selenium (Se) may be 30 to 69 at %.

As described above, an electrical characteristic such as a drift characteristic, thermal stability, and a threshold voltage (Vth) of the selection element may be improved by including a group 13 element having an appropriate concentration in the chalcogenide film. In addition, the characteristic of the variable resistance memory device, the semiconductor memory, or the electronic device may be improved.

FIG. 4A is a graph illustrating a drift characteristic of the selection element including a group 13 element. The drift characteristic represents a change of the threshold voltage (Vth) of the selection element over time. The X axis represents a film that is doped with a group 13 element and a film that is not doped with a group 13 element, and a Y axis represents a drift value in units of mV/decade. Except for the presence of the group 13 element, the two films in the X axis are the same.

Referring to FIG. 4A, the drift may decrease by doping the chalcogenide film with a group 13 element. As described above, the change of the threshold voltage (Vth) over time may be decreased by doping the chalcogenide film to have a predetermined concentration of a group 13 element. The figure illustrates that the chalcogenide film that is doped with a group 13 element has substantially lower change in resistance over time compared to a film that is not doped with a group 13 element. Accordingly, embodiments of the present disclosure may minimize changes in electrical resistance characteristics. Therefore, time dependent resistivity may be increased and drift deterioration may be improved.

FIG. 4B is a graph illustrating a bouncing characteristic of the selection element doped with the group 13 element. The bouncing characteristic represents the change of the threshold voltage (Vth) as the cycling of the selection element increases. The X axis represents a selection element in which the group 13 element is doped and a selection element in which the group 13 element is not doped, and the Y axis represents the change of the threshold voltage in units of mV/a.

Referring to FIG. 4B, the change of the threshold voltage is decreased by doping a group 13 element into the chalcogenide film. As described above, ionization of the chalcogenide film is increased by doping the chalcogenide film with an appropriate concentration of the group 13 element. Therefore, a shallow trap existing inside the energy band gap may decrease, and a distribution of the threshold voltage (Vth) may be narrowed. Thus, random telegraph noise may be decreased and bouncing deterioration may be improved.

FIG. 4C is a graph illustrating how doping a chalcogenide film with a group 13 element affects a delta VFF characteristic of the film. The X axis represents of a case where the group 13 element is doped and a case where the group 13 element is not doped, and the Y axis represents a delta VFF value in units of mV/a.

The delta VFF represents a difference VFF-Vth between a threshold voltage value at the time of manufacture of the selection element and a threshold voltage value after an initial switching operation (a first firing). In general, the chalcogenide film during deposition has a resistance value similar to that of a non-conductor, however, the resistance value of the chalcogenide film changes after the initial switching operation. When a variation of the resistance value or a variation of the threshold voltage is large, the selection element may be deteriorated, and thus it is necessary to decrease the delta VFF.

Referring to FIG. 4C, the delta VFF is decreased by doping the chalcogenide film with a group 13 element. That is, the resistance change of the switching film and the change of the threshold voltage of the switching film may decrease and the delta VFF may be improved by doping the group 13 element into the chalcogenide film.

Figure 5:
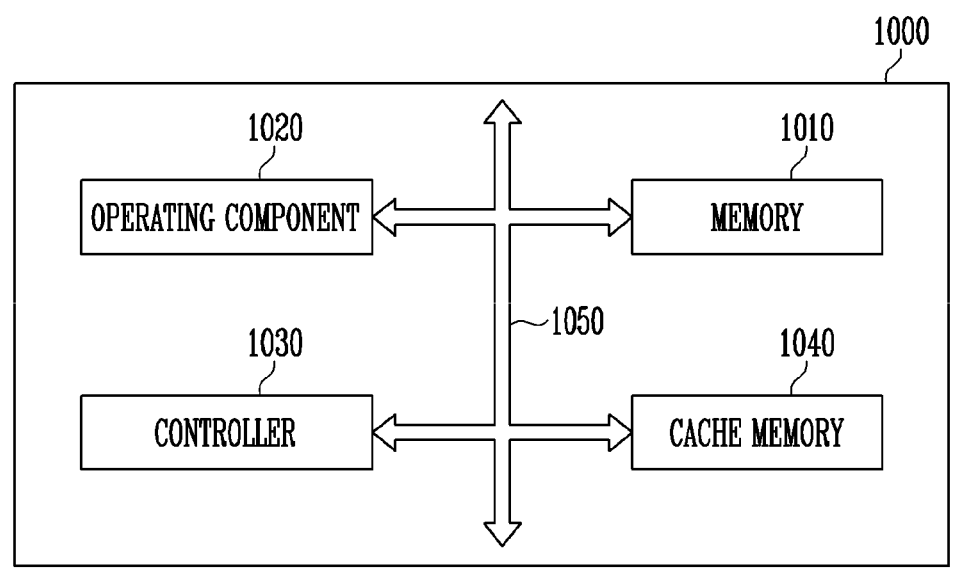
FIG. 5 is a configuration diagram of a microprocessor implementing a memory device according to an embodiment of the present disclosure.

FIG. 5 is a configuration diagram of a microprocessor implementing a memory device according to an embodiment of the present disclosure.

Referring to FIG. 5, the microprocessor 1000 may control and adjust a series of processes of receiving data from various external devices, processing the data, and transmitting a result of the process to the external device, and may include a memory 1010, an operating component 1020, a controller 1030, and the like. The microprocessor 1000 may be various data processing devices such as a central processing unit (CPU), a graphic processing unit (GPU), and a digital signal processor (DSP), an application processor.

The memory 1010 may be a processor register, a register, or the like, may store data in the microprocessor 1000, may include a data register, an address register, a floating point register, and the like, and may further include various registers.

The memory 1010 may temporarily store addresses at which data for performing an operation in the operating component 1020, data of a result of the performance, and data for the performance are stored.

The memory 1010 may include one or more embodiments of the electronic device described above. For example, the memory 1010 may include a chalcogenide material including germanium (Ge), arsenic (As), selenium (Se), and a group 13 element, and including 0.5 to 10 at % of the group 13 element. Therefore, an operation characteristic of the memory 1010 may be improved. As a result, an operation characteristic of the microprocessor 1000 may be improved.

The operating component 1020 may perform various arithmetic operations or logical operations according to a result obtained by decoding an instruction by the controller 1030. The operating component 1020 may include one or more arithmetic and logic units (ALUs) and the like.

The controller 1030 may receive a signal from an external device such as the memory 1010, the operating component 1020, and the microprocessor 1000, perform extraction or decoding of an instruction and control of a signal input/output of the microprocessor 1000, and the like, and execute a process indicated by a program.

The microprocessor 1000 according to the present embodiment may further include a cache memory 1040 capable of temporarily storing data input from an external device or data to be output to an external device, in addition to the memory 1010. In this case, the cache memory 1040 may exchange data with the memory 1010, the operating component 1020, and the controller 1030 through a bus interface 1050.

Figure 6:
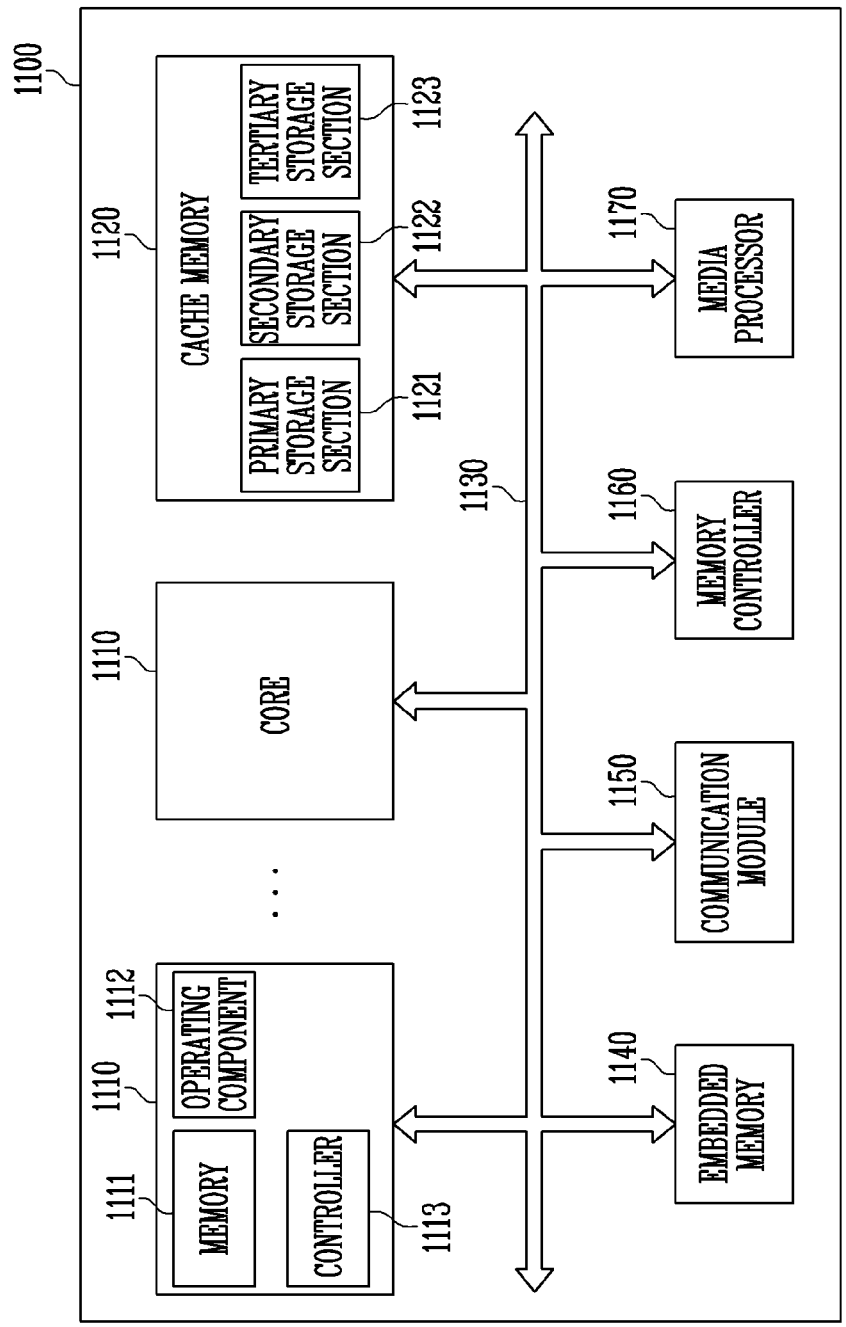
FIG. 6 is a configuration diagram of a processor implementing a memory device according to an embodiment of the present disclosure.

FIG. 6 is a configuration diagram of a processor implementing a memory device according to an embodiment of the present disclosure.

Referring to FIG. 6, the processor 1100 may include various functions in addition to the functions of a microprocessor for controlling and adjusting a series of processes of receiving data from various external devices, processing the data, and transmitting a result of the process to the external device, and thus performance improvement and multi-function may be implemented. The processor 1100 may include a core 1110 serving as a microprocessor, a cache memory 1120 temporarily store data, and a bus interface 1130 for transferring data between internal and external devices. The processor 1100 may include various system on chips (SoCs) such as a multi core processor, a graphic processing unit (GPU), and an application processor (AP).

The core 1110 of the present embodiment may be a part for performing an arithmetic logic operation on data input from an external device and may include a memory 1111, an operating component 1112, and a controller 1113.

The memory 1111 may be a processor register, a register, or the like, may store data in the processor 1100, may include a data register, an address register, a floating point register, and the like, and may further include various registers. The memory 1111 may temporarily store addresses at which data for performing an operation in the operating component 1112, data of a result of the performance, and data for the performance are stored. The operating component 1112 may be a part performing an operation in the processor 1100, and may perform various arithmetic operations, logical operations, and the like according to a result obtained by decoding an instruction by the controller 1113. The operating component 1112 may include one or more arithmetic and logic units (ALUs) and the like. The controller 1113 may receive a signal from an external device such as the memory 1111, the operating component 1112, and the processor 1100, perform extraction or decoding of an instruction, control of a signal input/output of the processor 1000, and the like, and execute a process indicated by a program.

The cache memory 1120 temporarily stores data to compensate for a data process speed difference between the core 1110 operating at a high speed and an external device operating at a low speed. The cache memory 1120 may include a primary storage section 1121, a secondary storage section 1122, and a tertiary storage section 1123. In general, the cache memory 1120 includes the primary storage section 1121 and the secondary storage section 1122, and may include the tertiary storage section 1123 when a high capacity is required. The cache memory 1120 may include more storages as needed. That is, the number of storages included in the cache memory 1120 may vary depending on design. Here, process speeds for storing and discriminating data in the primary, secondary, and tertiary storage sections 1121, 1122, and 1123 may be the same or different. When the process speeds of each storage are different, the speed of the primary storage may be the fastest. One or more of the primary storage section 1121, the secondary storage section 1122, and the tertiary storage section 1123 of the cache memory 1120 may include one or more embodiments of the semiconductor device described above. For example, the cache memory 1120 may include one or more embodiments of the electronic device described above. For example, the cache memory 1120 may include a chalcogenide material including germanium (Ge), arsenic (As), selenium (Se), and a group 13 element, and including 0.5 to 10 at % of the group 13 element.

FIG. 6 shows a case where all of the primary, secondary, and tertiary storage sections 1121, 1122, and 1123 are configured in the cache memory 1120. However, all of the primary, secondary, and tertiary storage sections 1121, 1122, and 1123 may be configured outside the core 1110 and compensate for the process speed difference between the core 1110 and the external device. Alternatively, the primary storage section 1121 of the cache memory 1120 may be positioned inside the core 1110, and the secondary storage section 1122 and the tertiary storage section 1123 may be configured outside the core 1110 and thus a function of compensating the process speed difference may be further strengthened. Alternatively, the primary and secondary storage sections 1121 and 1122 may be positioned inside the core 1110, and the tertiary storage section 1123 may be positioned outside the core 1110.

The bus interface 1130 connects the core 1110, the cache memory 1120, and an external device so as to efficiently transmit data.

The processor 1100 according to the present embodiment may include a plurality of cores 1110 and the plurality of cores 1110 may share the cache memory 1120. The plurality of cores 1110 and the cache memory 1120 may be directly connected to each other or may be connected to each other through the bus interface 1130. All of the plurality of cores 1110 may be configured equally to the core described above. When the processor 1100 includes the plurality of cores 1110, the primary storage section 1121 of the cache memory 1120 may be configured in the respective cores 1110 corresponding to the number of the plurality of cores 1110, and the secondary storage section 1122 and the tertiary storage section 1123 may be configured outside the plurality of cores 1110 to be shared through the bus interface 1130. Here, the process speed of the primary storage section 1121 may be faster than the process speeds of the secondary and tertiary storage sections 1122 and 1123. In another embodiment, the primary storage section 1121 and the secondary storage section 1122 may be configured in the respective cores 1110 corresponding to the number of the plurality of cores 1110, and the tertiary storage section 1123 may be configured outside the plurality of cores 1110 to be shared through the bus interface 1130.

The processor 1100 according to the present embodiment may include an embedded memory 1140 that stores data, a communication module 1150 that may transmit and receive data in a wired manner or wirelessly with an external device, a memory controller 1160 that drives an external storage device, a media processor 1170 that processes data processed by the processor 1100 and input from an external input device and outputs the processed data to an external interface device, and the like. In addition, the processor 1100 may further include a plurality of modules and devices. In this case, the plurality of added modules may exchange data with the core 1110 and the cache memory 1120 through the bus interface 1130.

Here, the embedded memory 1140 may include a non-volatile memory as well as a volatile memory. The volatile memory may include a dynamic random access memory (DRAM), a mobile DRAM, a static random access memory (SRAM), a memory performing a function similar to that of these, and the like. The non-volatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), a memory performing a function similar to that of these, and the like.

The communication module 1150 may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

The memory controller 1160 is for processing and managing data transmitted between the processor 1100 and an external storage device operating according to a different communication standard. The memory controller 1160 may include various memory controllers, for example, a controller that controls integrated device electronics (IDE), serial advanced technology attachment (SATA), a small computer system interface (SCSI), redundant array of independent disks (RAID), a solid state disk (SSD), external SATA (eSATA), personal computer memory card international association (PCMCIA), a universal serial bus (USB), a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), a compact flash (CF) card, and the like.

The media processor 1170 may process data processed by the processor 1100 and data input as an image, a voice, and other formats from an external input device, and may output the data to an external interface device. The media processor 1170 may include a graphics processing unit (GPU), a digital signal processor (DSP), high-definition audio (HD Audio), high-definition multimedia interface (HDMI) controller, and the like.

Figure 7:
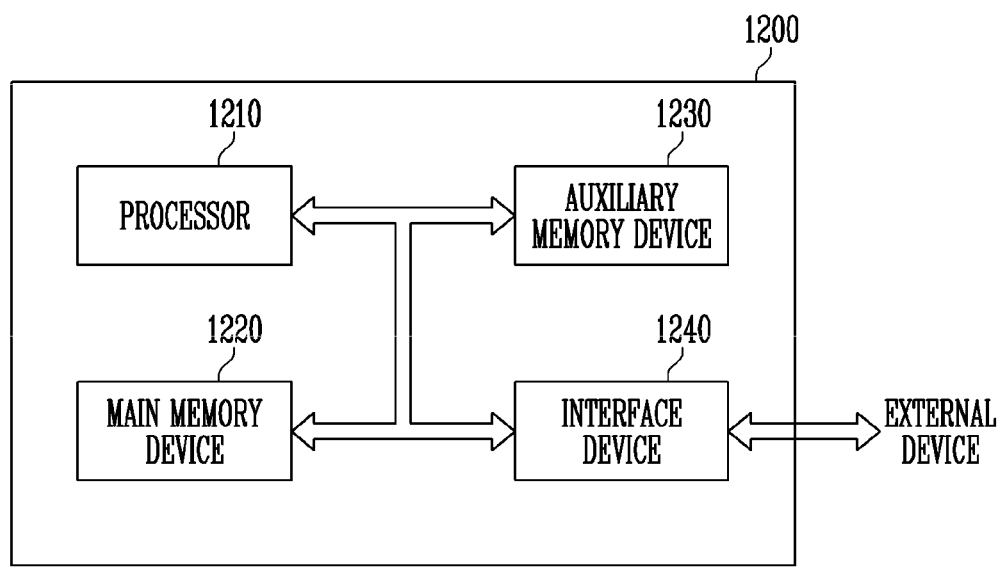
FIG. 7 is a configuration diagram of a system implementing a memory device according to an embodiment of the present disclosure.

FIG. 7 is a configuration diagram of a system implementing a memory device according to an embodiment of the present disclosure.

Referring to FIG. 7, a system 1200 is a device that processes data, and may perform input, process, output, communication, storage, and the like in order to perform a series of operations on data. The system 1200 may include a processor 1210, a main memory device 1220, an auxiliary memory device 1230, an interface device 1240, and the like. The system 1200 of the present embodiment may be various electronic systems operating using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual system, a smart television, or the like.

The processor 1210 may control processes of analysis of an input command, an operation, comparison, and the like of data stored in the system 1200. The processor 1210 may include a microprocessor unit (MPU), a central processing unit (CPU), a single/multi core processor, a graphic processing unit (GPU), an application processor (AP), a digital signal processor (DSP), and the like.

The main memory device 1220 is a memory space capable of moving, storing, and executing a program code or data from the auxiliary memory device 1230 when the program is executed. A stored content may be preserved even though power is shut off. The main memory device 1220 may include one or more embodiments of the electronic device described above. For example, the main memory device 1220 may include a chalcogenide material including germanium (Ge), arsenic (As), selenium (Se), and a group 13 element, and including 0.5 to 10 at % of the group 13 element. As a result, an operation characteristic of the system 1200 may be improved.

In addition, the main memory device 1220 may further include a static random access memory (SRAM), a dynamic random access memory (DRAM), or the like of a volatile memory type in which all contents are erased when power is turned off. Alternatively, the main memory device 1220 may not include the semiconductor device of the embodiment described above and may further include a static random access memory (SRAM), a dynamic random access memory (DRAM), or the like of a volatile memory type in which all contents are erased when power is turned off.

The auxiliary memory device 1230 refers to a memory device for storing a program code or data. The auxiliary memory device 1230 is slower than the main memory device 1220 but may store a lot of data. The auxiliary memory device 1230 may include one or more embodiments of the electronic device described above. For example, the auxiliary memory device 1230 may include a chalcogenide material including germanium (Ge), arsenic (As), selenium (Se), and a group 13 element, and including 0.5 to 10 at % of the group 13 element. As a result, an operation characteristic of the system 1200 may be improved.

In addition, the auxiliary memory device 1230 may further include a data storage system (refer to 1300 of FIG. 8) such as a magnetic tape using magnetism, a magnetic disk, a laser disk using light, a magneto-optical disk using the magnetism and light, a solid state disk (SSD), a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card. Alternatively, the auxiliary memory device 1230 may not include the semiconductor device of the embodiment described above and may include data storage systems (refer to 1300 of FIG. 8) such as a magnetic tape using magnetism, a magnetic disk, a laser disk using light, a magneto-optical disk using the magnetism and light, a solid state disk (SSD), a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The interface device 1240 may be for exchanging an instruction, data, and the like between the system 1200 of the present embodiment and an external device. The interface device 1240 may be a keypad, a keyboard, a mouse, a speaker, a microphone, a display, various human interface devices (HIDs), a communication device, and the like. The communication device may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

Figure 8:
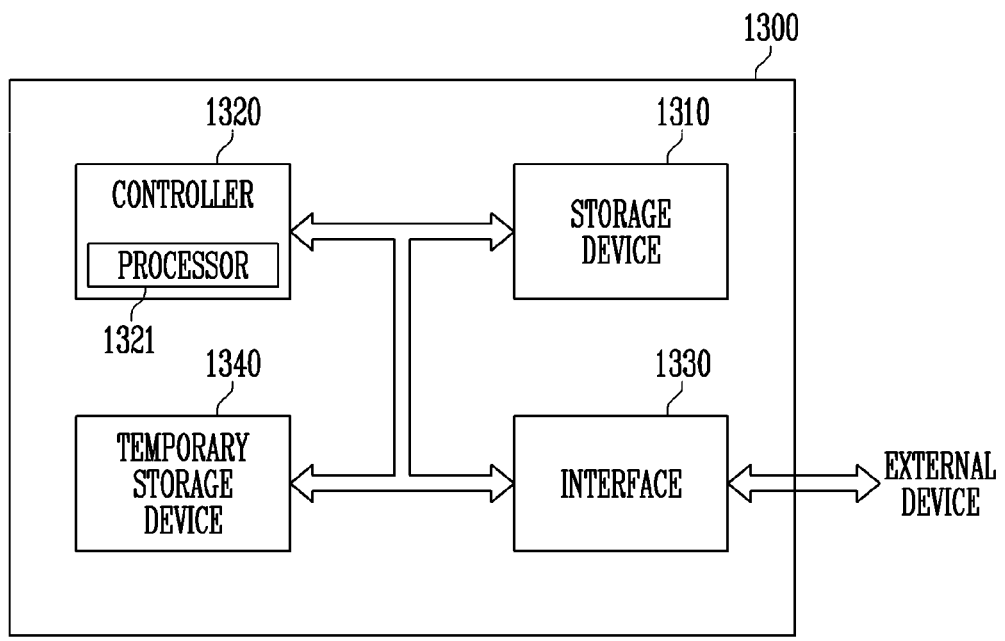
FIG. 8 is a configuration diagram of a data storage system implementing a memory device according to an embodiment of the present disclosure.

FIG. 8 is a configuration diagram of a data storage system implementing a memory device according to an embodiment of the present disclosure.

Referring to FIG. 8, the data storage system 1300 may include a storage device 1310 having a non-volatile characteristic as a configuration for storing data, a controller 1320 that controls the storage device 1310, an interface 1330 for connection with an external device, and a temporary storage device 1340 for temporarily storing data. The data storage system 1300 may be a disk type such as a hard disk drive (HDD), a compact disk read only memory (CDROM), a digital versatile disk (DVD), and a solid state disk (SSD), and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The storage device 1310 may include a non-volatile memory that semi-permanently stores data. Here, the non-volatile memory may include a read only memory (ROM), a NOR flash memory, a NAND flash memory, a phase change random access memory (PRAM), a resistive random access memory (RRAM), a magnetic random access memory (MRAM), and the like.

The controller 1320 may control exchange of data between the storage device 1310 and the interface 1330. To this end, the controller 1320 may include a processor 1321 that performs an operation or the like for processing commands input through the interface 1330 from the outside of the data storage system 1300.

The interface 1330 is for exchanging an instruction, data, and the like between the data storage system 1300 and an external device. When the data storage system 1300 is a card, the interface 1330 may be compatible with an interface used in a device such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card, or may be compatible with an interface used in a device similar to these devices. When the data storage system 1300 is a disk type, the interface 1330 may be compatible with an interface such as integrated device electronics (IDE), serial advanced technology attachment (SATA), a small computer system interface (SCSI), external SATA (eSATA), personal computer memory card international association (PCM-CIA), and a universal serial bus (USB), or may be compatible with an interface similar to these interfaces. The interface 1330 may be compatible with one or more interfaces having different types.

The temporary storage device 1340 may temporarily store data in order to efficiently transfer data between the interface 1330 and the storage device 1310 according to diversification and high performance of the interface with the external device, the controller, and the system. The temporary storage device 1340 may include one or more embodiments of the electronic device described above. For example, the temporary storage device 1340 may include a chalcogenide material including germanium (Ge), arsenic (As), selenium (Se), and a group 13 element, and including 0.5 to 10 at % of the group 13 element. Therefore, an operation characteristic of the temporary storage device 1340 may be improved. As a result, an operation characteristic of the data storage system 1300 may be improved.

Figure 9:
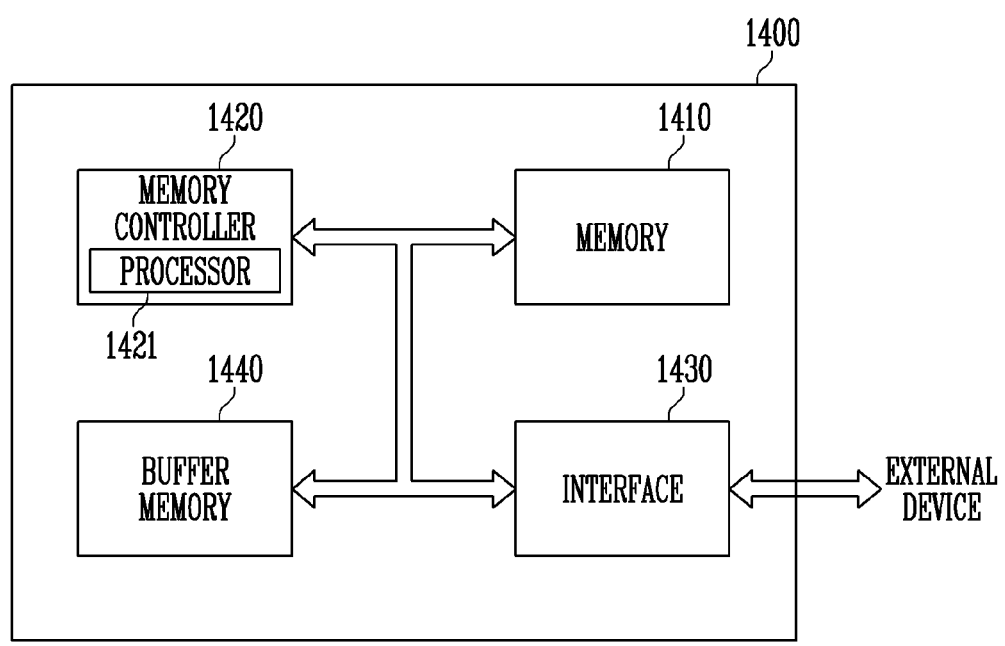
FIG. 9 is a configuration diagram of a memory system implementing a memory device according to an embodiment of the present disclosure.

FIG. 9 is a configuration diagram of a memory system implementing a memory device according to an embodiment of the present disclosure.

Referring to FIG. 9, the memory system 1400 may include a memory 1410 having a non-volatile characteristic as a configuration for storing data, a memory controller 1420 that controls the memory 1410, an interface 1430 for connection with an external device, and the like. The memory system 1400 may be a disk type such as a solid state disk (SSD), and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The memory 1410 that stores data may include one or more embodiments of the electronic device described above. For example, the memory 1410 may include a chalcogenide material including germanium (Ge), arsenic (As), selenium (Se), and a group 13 element, and including 0.5 to 10 at % of the group 13 element. Therefore, an operation characteristic of the memory 1410 may be improved. As a result, an operation characteristic of the memory system 1400 may be improved.

In addition, the memory of the present embodiment may include a read only memory (ROM), a NOR flash memory, a NAND flash memory, a phase change random access memory (PRAM), a resistive access memory (RRAM), a magnetic random access memory (MRAM), and the like having a non-volatile characteristic.

The memory controller 1420 may control exchange of data between the memory 1410 and the interface 1430. To this end, the memory controller 1420 may include a processor 1421 for processing and operating commands input through the interface 1430 from the outside of the memory system 1400.

The interface 1430 is for exchanging an instruction, data, and the like between the memory system 1400 and an external device. The interface 1430 may be compatible with an interface used in a device such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card, or may be compatible with an interface used in a device similar to these devices. The interface 1430 may be compatible with one or more interfaces having different types.

The memory system 1400 of the present embodiment may further include a buffer memory 1440 for efficiently transferring input/output of data between the interface 1430 and the memory 1410 according to diversification and high performance of the interface with the external device, the memory controller, and the memory system. The buffer memory 1440 that temporarily stores data may include one or more embodiments of the electronic device described above. For example, the buffer memory 1440 may include a chalcogenide material including germanium (Ge), arsenic (As), selenium (Se), and a group 13 element, and including 0.5 to 10 at % of the group 13 element. As a result, an operation characteristic of the memory system 1400 may be improved.

In addition, the buffer memory 1440 of the present embodiment may further include a static random access memory (SRAM) and a dynamic random access memory (DRAM) having a volatile characteristic, a read only memory (ROM), a NOR flash memory, a NAND flash memory, a phase change random access memory (PRAM), a resistive random access memory (RRAM), a spin transfer torque random access memory (STTRAM), and a magnetic random access memory (MRAM) having a non-volatile characteristic, and the like. Alternatively, the buffer memory 1440 may not include the semiconductor device of the embodiment described above, and may include a static random access memory (SRAM) and a dynamic random access memory (DRAM) having a volatile characteristic, a read only memory (ROM), a NOR flash memory, a NAND flash memory, a phase change random access memory (PRAM), a resistive random access memory (RRAM), a spin transfer torque random access memory (STTRAM), and a magnetic random access memory (MRAM) having a non-volatile characteristic, and the like.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. A chalcogenide material in an amorphous state comprising:
   germanium (Ge), arsenic (As), selenium (Se) and from 0.5 at % to 3 at % of at least one group 13 element,
   wherein a sum of a concentration of the germanium (Ge), a concentration of the arsenic (As) and a concentration of the selenium (Se) is from 97 at % to 99.5 at %.

2. The chalcogenide material of claim 1, wherein the chalcogenide material is $Ge_a As_b Se_c X_{1-(a+b+c)}$, wherein $0.12 \leq a \leq 0.33$, $0.12 \leq b \leq 0.36$, and $0.30 \leq c \leq 0.69$.

3. The chalcogenide material of claim 1, wherein the at least one group 13 element includes boron (B), aluminum (Al), gallium (Ga), indium (In), thallium (Tl), or a combination thereof.

4. The chalcogenide material of claim 1, wherein a concentration of the at least one group 13 element is less than half of a sum of the concentration of the germanium (Ge) and the concentration of the arsenic (As).

5. A variable resistance memory device comprising:
   a first electrode;
   a second electrode; and
   a chalcogenide film in an amorphous state interposed between the first electrode and the second electrode,
   wherein the chalcogenide film includes a group 13 element, a group 14 element, a group element, and a group 16 element,
   wherein a sum of a concentration of the group 14 element, a concentration of the group element, and a concentration of the group 16 element is from 97 at % to 99.5 at %, and
   wherein a concentration of the group 13 element is from 0.5 at % to 3 at % of at least one group 13 element.

6. The variable resistance memory device of claim 5, wherein the chalcogenide film and is an ovonic threshold switching material.

7. The variable resistance memory device of claim 5, wherein the chalcogenide film is a ternary chalcogenide switching material including the group 14 element, the group 15 element, and the group 16 element.

8. The variable resistance memory device of claim 7, wherein a concentration of the group 13 element is less than half of a sum of the concentration of the group 14 element and the concentration of the group 15 element.

9. The variable resistance memory device of claim 5, wherein the chalcogenide film is $Ge_a As_b Se_c X_{1-(a+b+c)}$, and $0.12 \leq a \leq 0.33$, $0.12 \leq b \leq 0.36$, and $0.30 \leq c \leq 0.69$.

10. An electronic device comprising a semiconductor memory,
    wherein the semiconductor memory comprises:
    a column line;
    a row line intersecting the column line; and
    a memory cell positioned between the column line and the row line,
    wherein the memory cell comprises a chalcogenide film in an amorphous state including germanium (Ge), arsenic (As), selenium (Se), and from 0.5 to 3 at % of at least one group 13 element, and
    wherein a sum of a concentration of the germanium (Ge), a concentration of the arsenic (As) and a concentration of the selenium (Se) is from 97 at % to 99.5 at %.

11. The electronic device of claim 10, wherein the memory cell comprises a selection element including the chalcogenide film and a memory element coupled to the selection element.

12. The electronic device of claim 10, wherein the chalcogenide film is $Ge_a As_b Se_c X_{1-(a+b+c)}$, and $0.12 \leq a \leq 0.33$, $0.12 \leq b \leq 0.36$, and $0.30 \leq c \leq 0.69$.

13. The electronic device of claim 10, wherein the at least one group 13 element includes boron (B), aluminum (Al), gallium (Ga), indium (In), thallium (Tl), or a combination thereof.

14. The electronic device of claim 10, wherein a concentration of the at least one group 13 element is less than half of a sum of the concentration of the germanium (Ge) and the concentration of the arsenic (As).

* * * * *